(12) United States Patent
Rearick et al.

(10) Patent No.: US 6,708,139 B2
(45) Date of Patent: Mar. 16, 2004

(54) METHOD AND APPARATUS FOR MEASURING THE QUALITY OF DELAY TEST PATTERNS

(75) Inventors: Jeff Rearick, Ft Collins, CO (US); Manish Sharma, Urbana, IL (US)

(73) Assignee: Agilent Technologies, Inc., Palo Alto, CA (US)

( * ) Notice: Subject to any disclaimer, the term of this patent is extended or adjusted under 35 U.S.C. 154(b) by 100 days.

(21) Appl. No.: 10/137,534

(22) Filed: Apr. 30, 2002

(65) Prior Publication Data

US 2003/0204350 A1 Oct. 30, 2003

(51) Int. Cl.[7] .............................................. G06F 15/00
(52) U.S. Cl. ........................ 702/185; 702/117; 702/123; 702/185; 324/500; 324/512; 324/527; 716/4; 716/6; 716/18; 714/700; 714/744
(58) Field of Search ...................... 702/58, 59, 117–119, 702/123–126, 185, 189, FOR 103, 104, 134, 170, 171; 714/700, 744; 324/238, 500, 512, 527, 531, 718; 716/4, 6, 18

(56) References Cited

U.S. PATENT DOCUMENTS

| | | | |
|---|---|---|---|
| 5,375,126 A | * | 12/1994 | Wallace ...................... 371/20.1 |
| 5,381,421 A | * | 1/1995 | Dickol et al. .................. 371/27 |
| 2002/0013921 A1 | * | 1/2002 | Takeoka ....................... 714/744 |
| 2003/0084390 A1 | * | 5/2003 | Tamarapalli et al. ........ 714/744 |

OTHER PUBLICATIONS

Chess et al, "Creating Small Fault Dictionaries", Mar. 1999, IEEE, vol.: 18, No.: 3, pp. 346–356.*
Goncalves et al., "Defect–Oriented Test Quality Assessment Using Fault Sampling and Simulation", Jan. 1999, INESC, pp. 1–8.*
Parkes et al. "Portable, Parallel, Object–Oriented Approach to Sequential Test Generation", Jun. 1994, UIUC pp. 1–6.*

* cited by examiner

Primary Examiner—Marc S. Hoff
Assistant Examiner—Elias Desta (57) ABSTRACT

A method and apparatus are provided for determining quality metrics associated with a test pattern used to test an integrated circuit (IC). The delays associated with (1) a longest sensitizable path through the IC that includes the delay fault and (2) an actual path exercised by the test pattern through the IC that includes the delay fault are determined. A difference between the delays is then obtained. The difference is then combined with a difference between a speed at which the test is performed and a design specification operating speed of the IC for the actual path. The sum represents the first quality metric associated with the test pattern for a given fault site. The ratio of the delays of the actual path to the longest sensitizable path represents the second quality metric associated with the test pattern for a given fault site. The metrics for the individual fault sites can be statistically combined into respective metrics at the IC level to assess the quality of a single test pattern or for a group of test patterns.

37 Claims, 9 Drawing Sheets

METHOD AND APPARATUS FOR MEASURING THE QUALITY OF DELAY TEST PATTERNS

TECHNICAL FIELD OF THE INVENTION

The present invention is generally related to integrated circuits (ICs) and, more particularly, to measuring the quality of delay tests used to test ICs for faults, or defects.

BACKGROUND OF THE INVENTION

After an IC is manufactured, it is tested on an IC tester before it is shipped to a customer. The goal of the testing is to verify that each individual IC was manufactured correctly without defects. At the highest level, testing may be reduced to simply plugging the IC into a host system and determining whether the system appears to be functioning normally while running applications. If the system works, then a determination may be made that the IC is ready to be shipped. However, this type of system-level test does not ensure that the IC is defect free, since the given applications used may exercise only a subset of the IC's functionality. This type of high-level system-based testing also requires a relatively large amount of time.

An alternative to the system test approach is known as functional testing. This type of testing is performed on a general-purpose IC tester (known as Automated Test Equipment, or ATE). This type of testing applies logic 1s and/or 0s to the input pins of the IC in order to stimulate all of the logic gates within the IC, and determines whether each logic gate outputs the correct result by observing the output pins of the IC. The patterns applied to and the results expected from each IC pin are stored in memory on the ATE and exercise the various functional aspects of the IC. If the IC responds correctly to all test stimuli, it is considered to be of shipment quality. However, given the complexity and sequential depth of modem ICs, creating a sufficiently thorough test to be applied via the pins is very difficult, and given the large number of pins on some ICs, the cost of the ATE resources can become prohibitive.

A third alternative to the system testing and functional testing approaches is known as structural testing. Instead of exercising the functional aspects of the IC, this type of testing applies logic 1s and/or 0s internally to stimulate all of the logic gates within the IC, and determines whether each logic gate outputs the correct result, again internally. This internal controllability and observability is obtained by using modified memory elements (flip-flops) inside the IC that are serially connected into a scan chain during test mode. This well-known technique of "scan design" has been in wide use for many years. In "full scan" designs, every internal flip-flop in the IC is made "scannable" by adding a serial access to a predecessor flip-flop and a successor flip-flop on the scan path during test mode. Thus, all the logic gates on the IC are surrounded by scannable flip-flops and become combinationally testable. In order to perform a scan test, data is serially shifted into all of the flip-flops in the scan path while the IC is in test mode, the resulting response of the logic gates to the final scanned-in state stimulus is captured by clocking all the flip-flops one or more times while the IC is in normal mode, and then by serially shifting the newly captured data out of the IC while in test mode. The captured data is analyzed by the ATE as it is shifted out to determine whether the correct results were obtained. The ATE is also responsible for switching the IC between normal and test modes appropriately as well as for providing the clock stimulus.

In order to create a structural test, a software tool uses a simulation model of the IC, which includes the scan flip-flops and all of the combinational logic of the IC. A "fault model" that represents hypothesized defects is superimposed on the simulation model of the IC in order to guide the creation of specific test patterns (also called test vectors) that are intended to expose faulty logic gates. The software tool then generates test patterns for each location in the IC model at which a fault, or defect, could exist. Each test pattern is a set of 1s and 0s that are necessary to excite and propagate the hypothesized fault to an observation point (i.e. a scannable flip-flop), as well as the expected response of a defect-free IC. If an IC responds to such a pattern with data other than that expected, then the hypothesized fault is deduced to be present and the IC is thus determined to be defective and is not shipped. The complete set of test patterns (called a test sequence or a test set) is intended to cover all possible faults in an IC.

The spectrum of all possible faults in an IC is, unfortunately, very broad. While many defects result in permanent logical errors that can be easily detected by scan-based tests, some defects manifest themselves only as increased delays in the IC. Therefore, if the scan test is performed without taking the speed at which the gates should respond into account, such "delay defects" may go undetected. For example, assuming a NOR gate that has a weak pull down transistor, the gate may produce the correct logical value if given enough time, but will not produce the value correctly under the timing specifications for the IC. Therefore, each gate must be checked to determine whether its logical function is correctly performed and whether it is performed in a timely fashion. A pattern that does not take timing into account is called a "static" test, while one that does execute under timing constraints is called a "dynamic" test. A dynamic test for a given logic gate is created by running two test patterns in sequence at full clock speed and determining whether a slow-to-rise (STR) or slow-to-fall (STF) delay fault exists.

For example, if one input of a two-input NOR gate is held at 0 for two clock cycles while the other input changes from a 0 on the first clock cycle to a 1 on the second clock cycle, the output should change from a 1 on the first clock cycle to a 0 on the second clock cycle. If the output does not change from a 1 to a 0 within specified timing margins, a slow-to-fall fault exists. Similarly, if one input of the NOR gate is held at 0 for two clock cycles while the other input changes from a 1 on the first clock cycle to a 0 on the second clock cycle, the output should change from a 0 on the first clock cycle to a 1 on the second clock cycle. If the output does not change from a 0 to a 1 within specified timing margins, a slow-to-rise fault exists.

Figure 1:
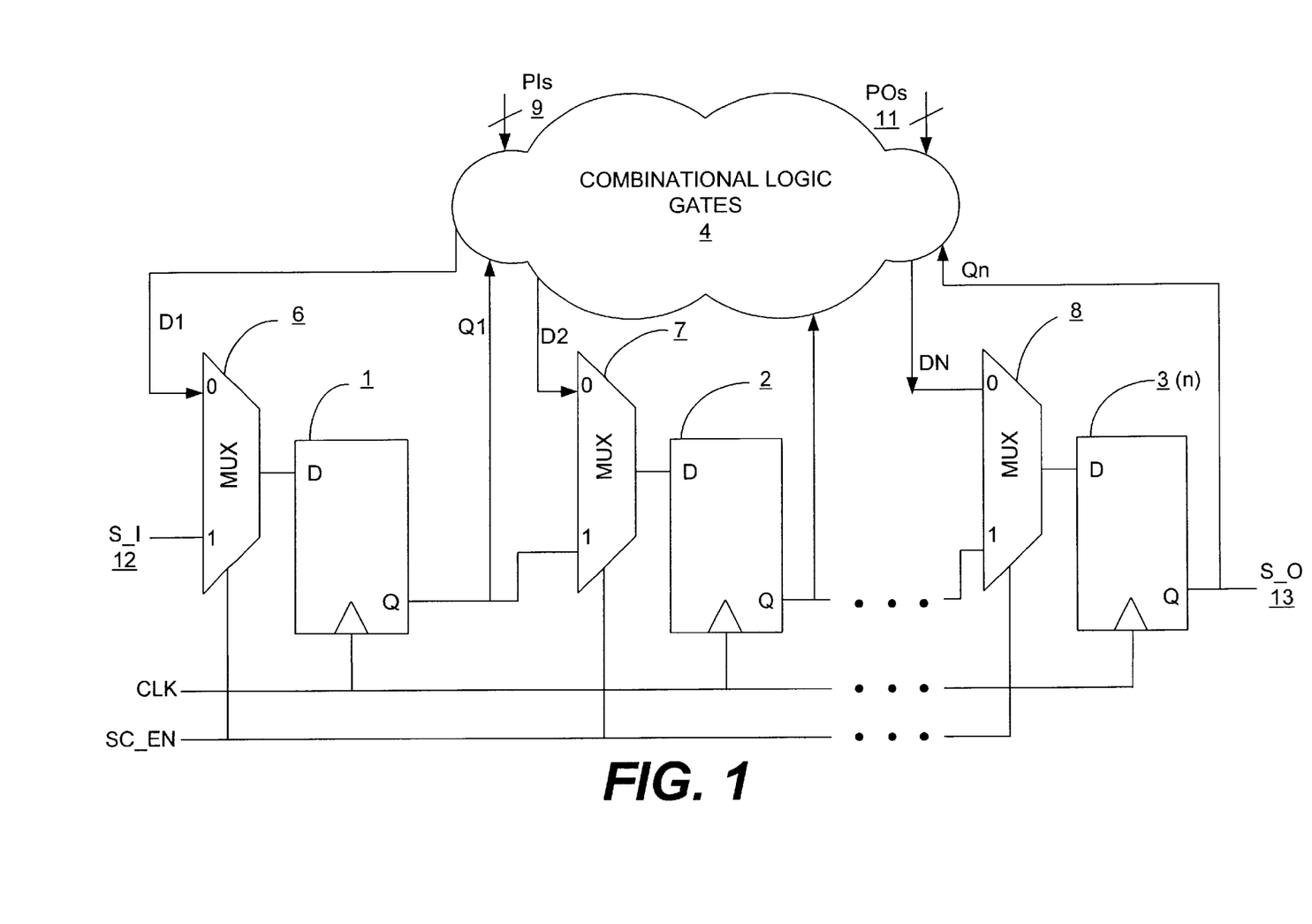
FIG. 1 is a block diagram of scan-based testing logic connected to combinational logic to enable static and dynamic tests to be performed on an IC.

FIG. 1 is a block diagram illustrating a series of scan flip-flops 1, 2, and 3 as well as combinational logic 4 of an IC that incorporates the aforementioned scan design and that can be used for performing static and dynamic tests. Each of the flip-flops 1, 2, and 3 has its data input, D, connected to the output of one of the multiplexers 6, 7, or 8, respectively. When the scan enable signal, SC_EN is low (i.e., not asserted), the data at input 0 of the multiplexers 6, 7, and 8 is captured by the flip-flops 1, 2, and 3, respectively, on the rising edge of the clock, CLK. Therefore, when the scan enable signal SC_EN is not asserted, the IC is functioning in the normal operational manner. The combinational logic 4 will normally receive a plurality of primary input signals 9 originating from the input pins of the IC and will drive a plurality of primary output signals 11 that terminate at the output pins of the IC. The scan chain begins at input S_I 12 and ends at output S_O 13. The flip-flops act as a serial shift register between these two points when the scan enable signal SC_EN is asserted.

The black dots separating flip-flops 2 and 3 are intended to indicate that the scan chain may, and normally does, include many more flip-flops than the three shown in the figure (e.g., 100,000 flip-flops on a contemporary IC is not uncommon). It should be noted that corresponding additional inputs and outputs of the combinational logic 4 are connected to these additional scan flip-flops not shown in FIG. 1 to enable every gate of the combinational logic to be tested using the scan design technique. It should also be noted that several independent scan chains can be used to link groups of flip-flops together instead of one long scan chain as shown.

Given this scan design architecture, several varieties of tests are possible. The first is to establish that the scan chain itself is functional. This is accomplished by asserting the scan enable signal SC_EN (i.e., setting it to logic 1 in this example scan design configuration) and then cycling the clock as many times as there are flip-flops on the scan chain to load the chain, then again cycling the clock that many times to unload the scan chain. The signals at the scan in inputs, S_I, of the multiplexers 6, 7, and 8 are captured by the flip-flops 1, 2, and 3, respectively, on each clock cycle. The first flip-flop on the scan chain captures the S_I input pin 12, and the last flip-flop on the scan chain drives the S_O output pin 13. The scan logic is functioning as one large shift register during this test, with each flip-flop outputting a data value on the rising edge of the clock CLK. During the second half of this test, the expected response of the S_O pin 13 should match the values delivered on the S_I pin 12 in the first half of the test.

For example, assuming the scan design logic shown in FIG. 1 comprises 100 flip-flops, 200 clock cycles will be issued to shift a 100-bit test pattern of 1s and/or 0s into the flip-flops and completely out again; SC_EN will be held high over the 200 clock cycles. If all 100 bits appear properly on the S_O pin 13 in order during the second half of the test, then the scan chain is operational.

Once a determination is made that the flip-flops are functioning properly as a scan chain, the combinational logic 4 can be tested. In this case, again assuming 100 flip-flops in the scan design chain, the SC_EN signal will be asserted and 100 clock cycles will be issued to enable a 100-bit test pattern to be shifted into the flip-flops. The final state shifted in at this point in the test is available at the Q-outputs of the flip-flops and corresponds to the stimulus portion of this test pattern. After the combinational logic 4 has settled, the circuit response is available at the 0 inputs of the multiplexers and is captured in the flip-flops by pulsing the clock CLK exactly once with the SC_EN signal held low. Then, by holding the SC_EN signal high and issuing 100 clock cycles, the captured response data is shifted out for analysis. The data shifted out is analyzed by the ATE to determine if the circuit responded to the stimulus properly (against the stored expected response as a reference).

Whether or not this type of test is static or dynamic depends upon the relative timing of the clock signal CLK and the test mode signal SC_EN. A static test would result when there is a pause between the application of the last shift action (the $100^{th}$ clock pulse with SC_EN high in this example) and the application of the capture event (the single clock pulse with SC_EN low). There are two well-known methods for applying dynamic tests. In the first, known as "last-shift-launch" or "skewed-load" testing, the SC_EN signal must be capable of being switched from high to low in between two at-speed clock pulses (the $100^{th}$ and $101^{st}$, in this example). This would apply two test patterns executed in sequence at speed, with the transitions caused by the last shifted state (from CLK 99 to CLK 100) in test mode being captured by CLK 101 in normal mode (just after SC_EN was lowered at speed). Although this is difficult to do, it has been accomplished in the past by carefully designing the SC_EN signal. Due to the difficulty of making the scan enable signal operate at speed, some designs perform delay testing at reduced speed, with consequent reduction in test quality. Alternatively, the second scheme for implementing dynamic tests, known as "functional justification", or "broadside" delay testing, relaxes this demand on the SC_EN signal, but requires two at-speed clocks during the time when SC_EN is low (i.e., during normal operation). This technique loops through the combinational logic 4 not once but twice, making the burden on the test pattern generation tools twice as great. For example, after the $100^{th}$ pulse of the clock CLK with the scan enable signal SC_EN high, SC_EN can be lowered at leisure (at any desired time), then the clock CLK is pulsed twice in succession at full chip speed. The transitions launched on the first of these two clock pulses are captured by the second pulse. The scan enable signal SC_EN is the raised at leisure, then 100 clock pulses are applied to shift out the captured data. It should be noted that the combinational logic 4 is exercised twice during the time when SC_EN was low.

In whatever manner dynamic tests are implemented, they are intended to detect delay faults. There are two popular delay fault models: transition faults (also known as gate delay faults) and path delay faults. A transition fault models the situation where a single gate in an IC is slow (i.e., it will produce the correct logical output, but not in a timely fashion). A path delay fault models the situation where several gates are marginally slow, such that any one of them won't adversely affect the ability of the circuit to run at speed, but the combination of all the incremental delays will cause the circuit to be too slow when a path connecting those gates is sensitized.

The quality of tests generated using the transition fault model is negatively affected by the "greedy" nature of test generation algorithms, which tend to select the easiest (i.e., shortest) route into and out of the gate in question, even when there are other (longer) routes that would make the transition test more sensitive to a given delay defect. The measurement of transition test quality has traditionally been in terms of whether or not a given transition fault was detected at all; no accounting for the exact paths used to implement the transition tests is made.

Figure 2:
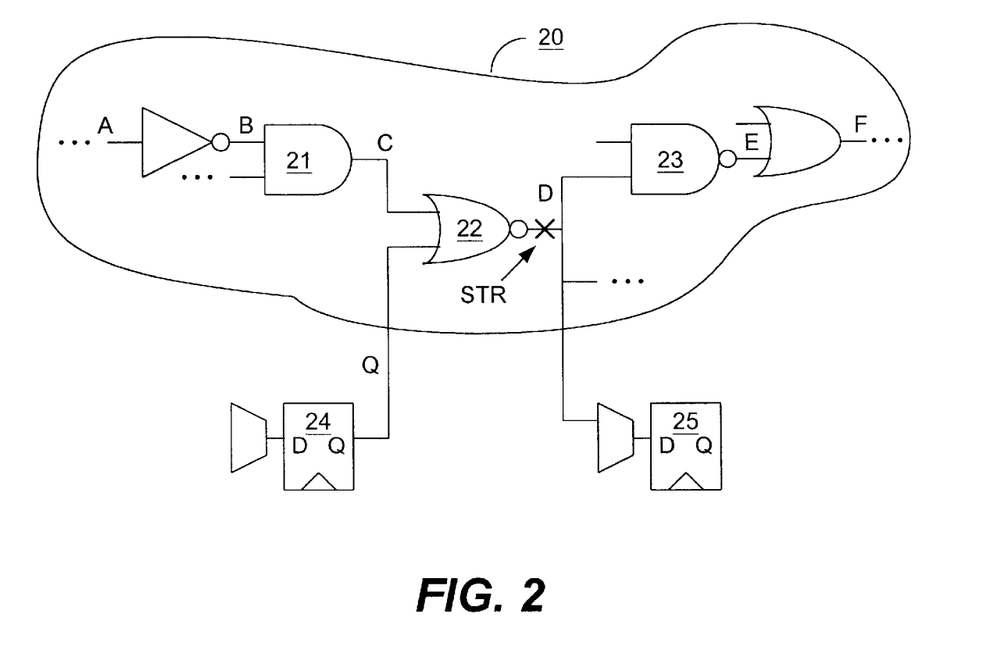
FIG. 2 is a schematic diagram of an example of a portion of combinational logic of an IC that comprises a defect that be detected by performing a delay fault test using the scan design shown in FIG. 1.

The manner in which transition fault testing suffers quality reduction due to short path selection will be described with reference to the schematic diagram of FIG. 2. The schematic diagram of FIG. 2 shows a simple example of what might be found in the combinational logic 20 of an IC. The logic 20 comprises, among other logic gates, an AND gate 21, a NOR gate 22, and a NAND gate 23, which are connected such that they form a portion of a logical path connecting circuit nodes B, C, D, and E. Also shown in the figure are two scan flip-flops 24 and 25, as well as a delay fault location marked with an "X" at the output of NOR gate 22.

Present transition fault test generation algorithms often take advantage of the direct controllability and observability, respectively, afforded by the scan flip-flops 24 and 25 and launch and capture a rising transition passing through the fault site by using these short paths into and out of the fault site. This choice, unfortunately, reduces the quality of the transition test pattern, since the length of the path through the fault site is not taken into account in determining whether or not a transition fault is detected by a test pattern. For example, assuming a slow-to-rise (STR) fault is located at the "X" on the output of NOR gate 22, a test pattern which produces two consecutive 0s from AND gate 21 at node C on two consecutive clock cycles while launching a falling transition from flip-flop 24 will be able to observe the fault effect at node D via flip-flop 25 on the second clock cycle. Specifically, if the input to flip-flop 25 does not change from 1 to 0 within the second clock cycle, a determination is made that a transition fault exists. If, however, the input to flip-flop 25 does fall from 1 to 0 within the second clock cycle, a determination is made that no defect exists. The problem with this determination is that a delay defect at said fault site could indeed exist, but could be too short in duration to affect the particular (short) path Q-D taken to test it. If, alternatively, the fault were tested by holding the output Q of flip-flop 24 at a constant logic 0 while propagating a transition along path A-B-C-D-E-F, or some other relatively long path through the fault site, then the determination that a passing test does in fact indicate the absence of a defect can be made with much more confidence.

There are three important time intervals with respect to the timing of a particular path: 1) the clock period, T, of the system clock which is connected to the flip-flops on either end of the path; 2) the delay of the path, D, which measures the time interval between the launch of a transition at the start of the path until the arrival of the transition at the end of the path; and 3) the slack of the path, S, which measures the difference between the arrival time of the transition at the end of the path and the next rising edge of the system clock (which is simply expressed as S=T−D). Timing analysis tools typically express their results in terms of path slack. Therefore, the expression "path slack", or simply "slack", will be used herein to denote this variable.

Figure 3A:
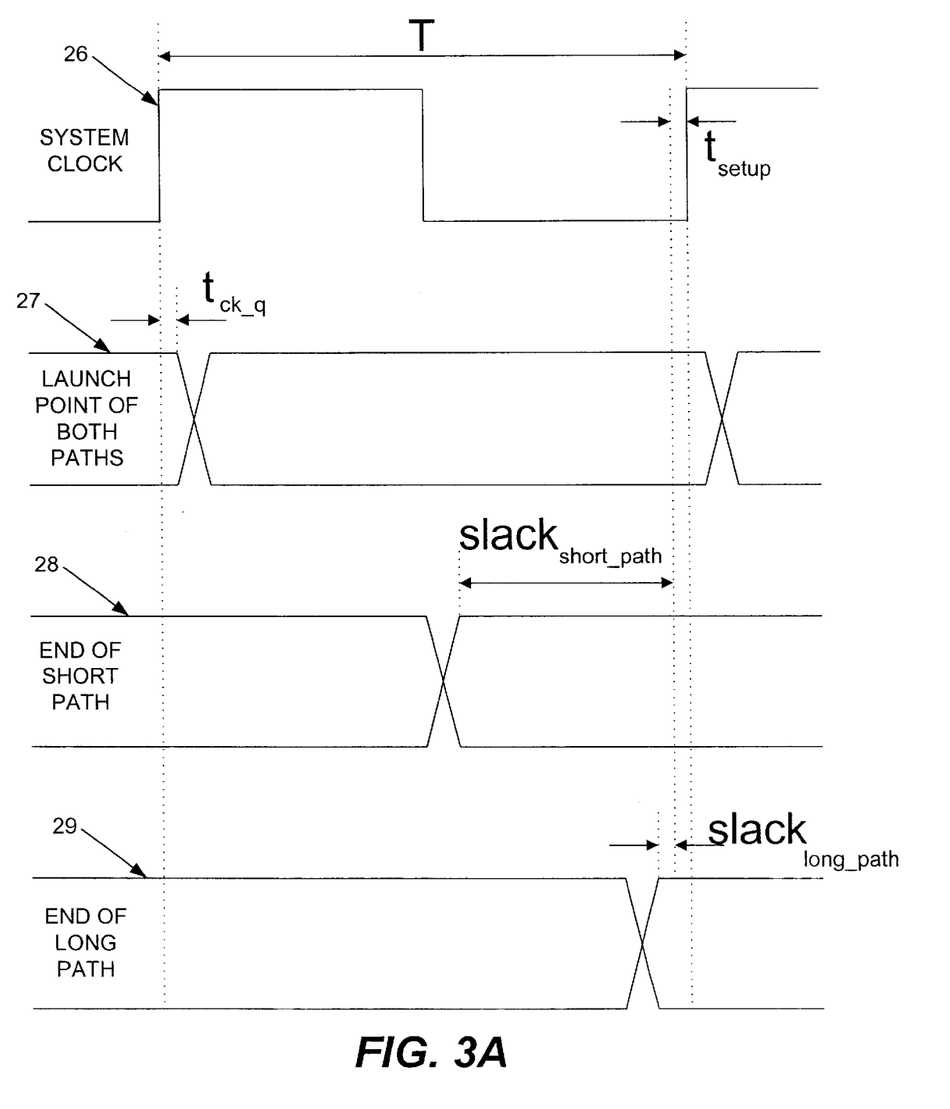
FIG. 3A is a timing diagram of an example portion of an IC showing the relative timing of the clock, a short path through the logic, and a long path through the logic.
Figure 3B:
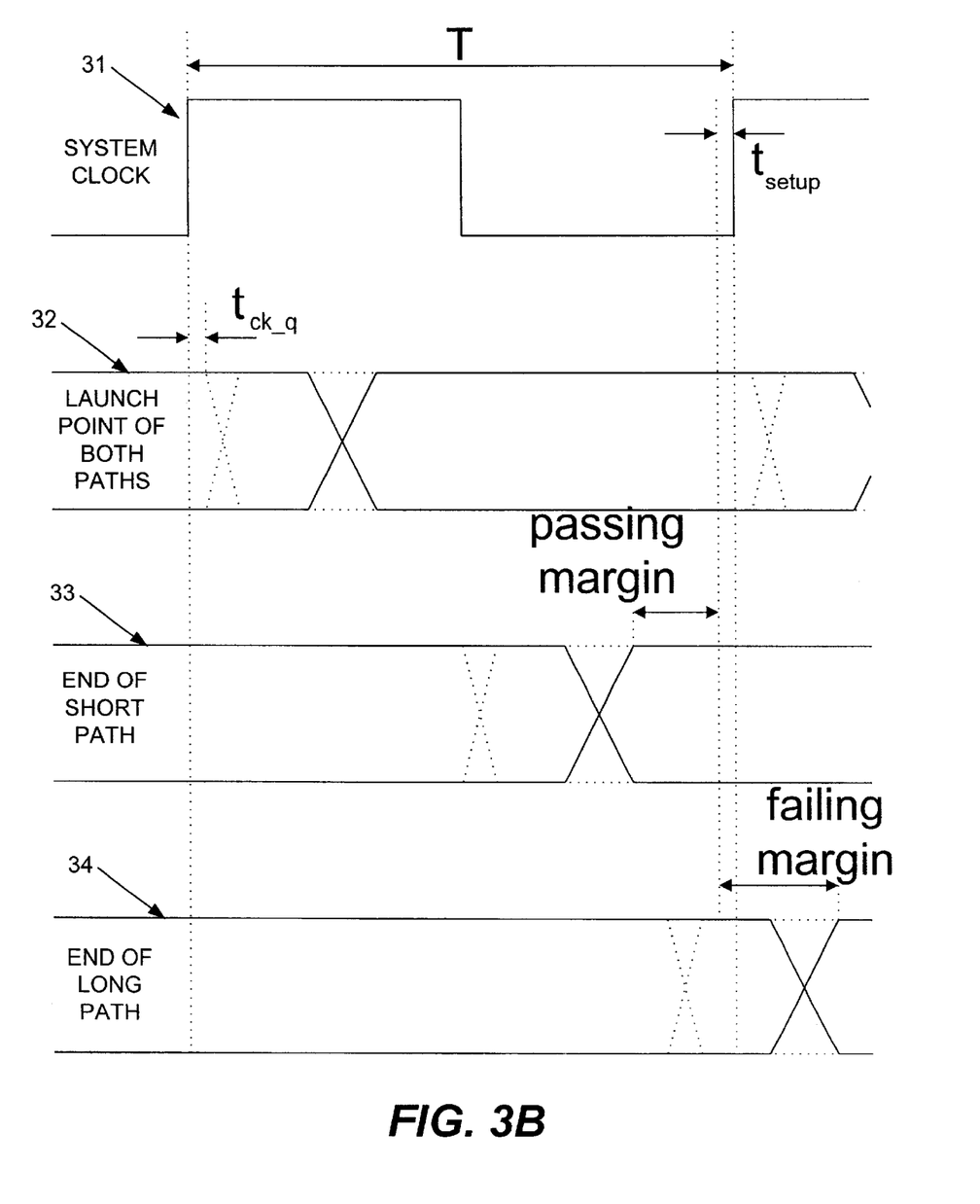
FIG. 3B is a timing diagram based on that shown in FIG. 3A, showing the effect of a delay defect on the relative timing of the clock, a short path through the logic, and a long path through the logic.

The impact of path selection on the quality of a delay fault test will be explained with reference to the timing diagrams in FIG. 3A and FIG. 3B. Both figures depict the timing waveforms for both a short path and a long path with respect to the clock waveform. FIG. 3A represents the defect-free case and FIG. 3B represents the case in which a delay defect is present. FIG. 3A shows, in order from top to bottom: the waveform 26 for the clock with a period of T time units (typically nanoseconds); the waveform 27 for a node representing a common launch point for both the short and the long paths, which experiences a transition one clock-to-Q delay time (T_ck_q) after the start of the clock period; the waveform 28 at the end of the short path, showing that the resultant transition occurs with plenty of slack time (SLACK_short_path) prior to the second rising edge of the clock; and, finally, the waveform 29 at the end of the long path, showing that its resultant transition occurs with very little slack time (SLACK_long_path) prior to the second rising edge of the clock.

It is clear that a delay defect on the long path could easily push the resultant transition beyond the second rising clock edge, which would case the delay test to fail since the wrong value would be captured. Exactly this situation is illustrated in FIG. 3B, which shows, in order from top to bottom: 1) the waveform 31 for the clock with a period of T time units (typically nanoseconds); 2) the waveform 32 for a node representing a common launch point for both the short and the long paths, which experiences a transition (shown in solid lines) delayed by a defect somewhat later than in the defect-free case (shown in dashed lines); 3) the waveform 33 at the end of the short path, showing that the resultant transition still occurs in time to beat the second rising clock edge (shown by the passing margin time); and, finally, 4) the waveform 34 at the end of the long path, showing that its resultant transition occurs well after the second rising clock edge (shown by the failing margin time). In this example, a test using the short path to test for the defect on the common launch point would falsely pass an IC manufactured with a delay defect of the duration shown, whereas a test using the long path would correctly identify the IC as defective. This is evident from the fact that the passing margin 35 associated with the short path 33 overlaps the failing margin 36 associated with the long path 34. It is clear that measuring the quality of transition fault tests must account for the actual path used to detect the faults.

Figure 4:
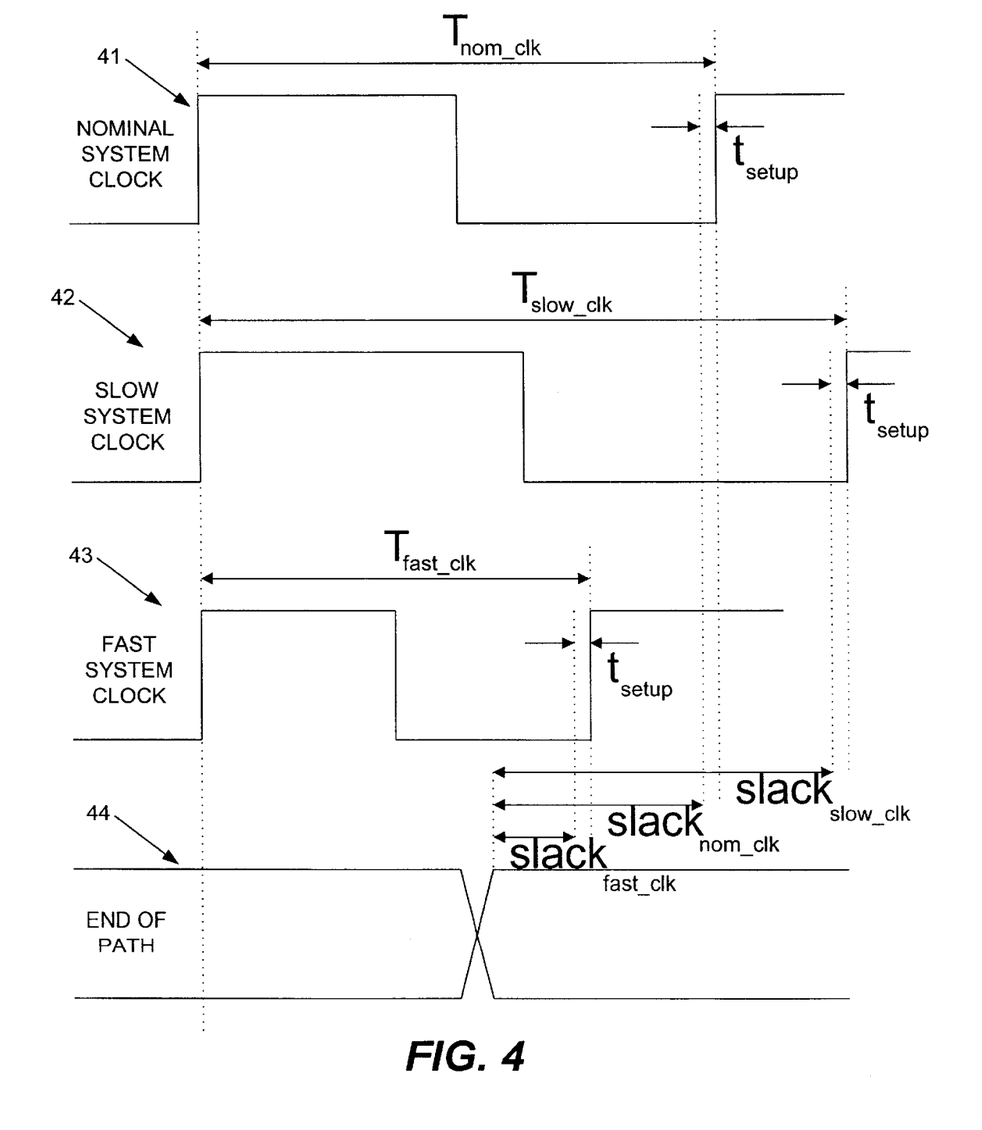
FIG. 4 is a timing diagram showing the effect of changing the clock period on the resultant slack in a path through the logic.

While the path delay fault model obviously does not suffer from the problem of using too short a path through a fault site, since, by definition, the path delay fault model fully specifies the path in question as comprising the fault site, it is, along with the transition fault model, subject to quality reduction by another factor, namely the actual speed of application of the test. The timing diagram in FIG. 4 represents the use of three different clock periods: 1) nominal 41, 2) slow 42, and 3) fast 43, respectively, to apply a delay test to a path. The bottom waveform 44 indicates the substantial change in timing slack that occurs as the clock period is varied. A relatively short path can be tested much more stringently by simply decreasing the period of the system clock (i.e., increasing the frequency of the system clock) such that the excess slack time is reduced thereby increasing the sensitivity of the test to smaller delay defects. Conversely, if the clock period is increased (due to inadequate ATE resources that limit the frequency at which clocks are applied, etc.), all paths will acquire additional slack and all tests will become less sensitive to small delay defects, risking the passage of a defective IC that could later fail in its normal operating environment at fill clock speed.

Therefore, transition fault tests and path delay tests can both be rendered less effective by this technique of slowing down the system clock. It is also important to note that speeding up the system clock to improve test quality will work only to the point at which the slack of the longest paths tested becomes negative as the clock period is decreased. At this point, every IC will fail the test (because the test has been made too stringent, in violation of the maximum design specification for the clock operating frequency).

Currently, quality metrics such as the length of the specific path used to detect a delay fault and the application speed on the tester are not used to measure the quality of delay tests. Consequently, tools used to generate test patterns also do not take such quality metrics into account in generating tests. Accordingly, a need exists for a technique that measures the quality of delay tests in order to ensure that the tests are capable of determining whether a detected defect is a defect that may make the IC perform improperly during operation.

SUMMARY OF THE INVENTION

In accordance with the present invention, a method and apparatus are provided for determining quality metrics associated with a set of test patterns used to test an integrated circuit (IC) for delay defects. Metrics are formulated for the test of each individual delay fault, and these individual metrics are collected into respective IC-wide metrics. The key metrics, both at the individual fault level and the IC level, are referred to herein as the "Delay Defect Exposure"

(or DDE, expressed in time units, such as nanoseconds), and the "Delay Sensitivity Ratio" (or DSR, expressed as a percentage). For both metrics, the delay time relative to the appropriate system clock associated with a longest sensitizable path through the IC that includes the fault site is determined, as well as the delay time relative to the same system clock of the actual path activated by the test pattern. Two metrics are then generated based on 1) the target path's delay time, 2) the longest sensitizable path's delay time, and 3) the application speed of the test on the IC tester with respect to the IC's operating speed specification.

In accordance with the preferred embodiment, the metric for Delay Defect Exposure (DDE) is determined as follows. The slack times associated with (1) a longest sensitizable path through the IC that includes the delay fault site and (2) the actual path exercised by the test pattern through the IC that includes the delay fault site are determined. A difference between these slack times is then obtained. The difference is then summed with the difference between (3) the speed at which the test is performed and (4) the design specification operating speed of the IC for the actual path. The sum represents the DDE quality metric associated with the test for this delay fault. The DDE indicates the size (i.e., time duration) of a delay defect that could escape the delay test but still cause some other path on the IC to fail in normal operation.

Preferably, the DDE is calculated for each fault site using the set of test patterns associated with each fault site to enable each test to be "graded" with respect to each delay fault. The resultant metrics for each fault site can be collected using standard statistical measures of mean, median, minimum, maximum, standard deviation, etc., to form IC-wide DDE metrics. The smaller the DDE value, the higher the quality of the test set at detecting small delay defects. In converse, the larger the DDE value, the lower the quality of the test set at detecting small delay defects.

In accordance with the preferred embodiment, the metric for Delay Sensitivity Ratio (DSR) is determined. To determine the DSR metric, the slack times associated with (1) the actual path exercised by the test pattern through the IC that includes the delay fault site is determined, and (2) a longest sensitizable path through the IC that includes the delay fault site is determined. The ratio between these slack times is then obtained. The ratio represents the DSR quality metric associated with the test for this delay fault. The DSR indicates the relative effectiveness of the actual path used to test the delay fault site with respect to the longest sensitizable path through that site.

Preferably, the DSR is calculated for each delay fault site using the set of test patterns associated with each fault site, thereby enabling each test to be "graded" with respect to each delay fault. The resultant metrics for each fault site can be collected using standard statistical measures of mean, median, minimum, maximum, standard deviation, etc., to form IC-wide DSR metrics. The closer the DSR value is to 1, the higher the quality of the test set is at detecting small delay defects. In converse, the closer the DSR value is to 0, the lower the quality the test set is at detecting small delay defects.

Therefore, by taking these different timing factors into account, a true quality metric can be derived for each test pattern with respect to each delay fault. Furthermore, the entire set of tests can be graded by statistically combining the component quality metrics at each fault site together to obtain an overall quality metric for the test set. Additionally, for each fault site, the individual test having the lowest DDE (and correspondingly the highest DSR) will be the best test pattern for testing that delay fault site.

These and other features and advantages will become apparent from the following description, drawings and claims.

DETAILED DESCRIPTION OF THE PREFERRED EMBODIMENT

As stated above, a delay fault test that uses the shortest path into and out of a delay fault site may result in a defect not being detected that would have been detected if a longer path that included the fault site had been tested. In other words, using the shortest path through the fault site during a test run may result in a delay being measured that does not use up a prohibitive amount of the clock cycle, and thus results in a determination that the delay fault does not render the IC defective. In accordance with the present invention, it has been determined that the highest quality delay fault test is one that uses the longest sensitizable path through the delay fault site. If the delay of a defect associated with the longest sensitizable path through the fault site uses up a prohibitive amount of the clock cycle, or more than one clock cycle, then the delay defect may result in the IC malfunctioning when it is put into operation. The longest sensitizable path through the delay fault site will detect the smallest defect. Therefore, the test that uses the longest sensitizable path is the most stringent, and thus is the highest quality test.

Additionally, for any given delay fault, the timing sensitivity may vary for different paths through the IC. However, it will be greatest for the longest sensitizable path through the delay fault site. Therefore, the delay associated with the longest sensitizable path through the delay fault site can be utilized as the basis for a quality metric for measuring the quality of test patterns for that particular fault site. If the delay associated with the longest sensitizable path through a fault site does not correspond to a prohibitive amount of the clock cycle, or more than a clock, then all other tests through that fault site will also pass because they are even less sensitive to the defect. Thus, if, for example, ten different test patterns exercise that fault site, each test pattern can be graded in terms of quality based the length of the particular path that each test used on its way through the site. The test pattern associated with the longest path through the fault site will correspond to the highest quality test pattern, which potentially allows the other test patterns for that particular fault site to be discarded. Therefore, the present invention provides for measuring the quality of test patterns, for selecting optimal test patterns to test a given delay fault, and for reducing the number of test patterns that are used to test an IC.

In accordance with the preferred embodiment, other factors in addition to the delay associated with the longest sensitizable path are used to determine the quality of each test pattern for each delay fault. Specifically, preferably static timing analysis is used to measure two quantities, in units of time, for each delay fault test pattern. These quantities are: (1) the path length (in units of time) of the actual path exercised by a given delay fault test pattern, and (2) the path length (in units of time) of the longest sensitizable path that contains the delay fault site. The relative difference between these two quantities is then obtained, which serves as a reliable measure of the relative sensitivity of a particular delay fault test pattern. In addition, for each section of circuitry in which a delay fault resides (i.e., in each clock domain of an IC), two other quantities, in units of time, are also obtained. These quantities are: (1) the actual test application speed and (2) the design specification operating speed. Preferably, all four of these quantities are then used to judge the quality of the delay test patterns for each delay fault site.

Figure 5:
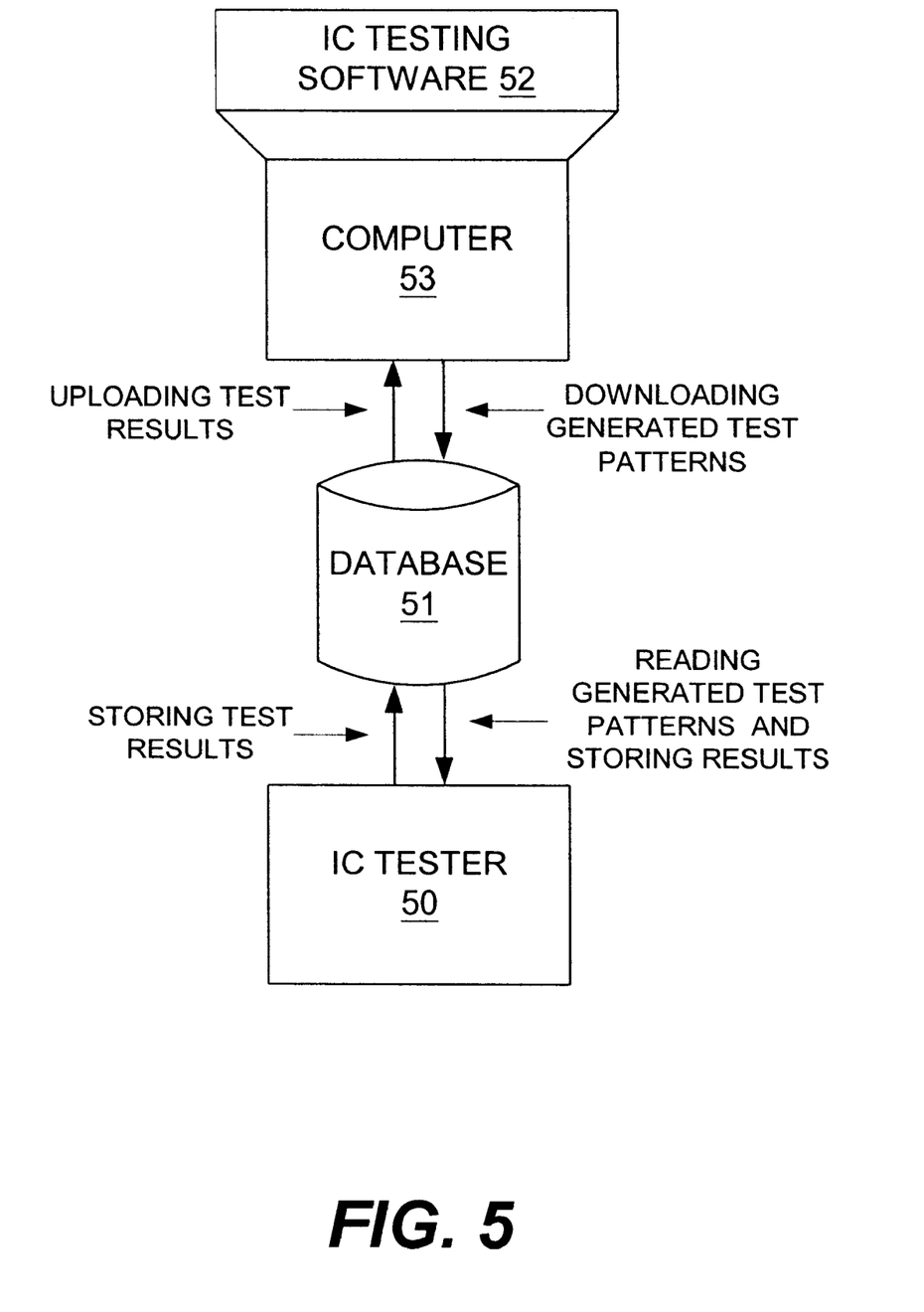
FIG. 5 is block diagram of a computer that executes IC test generation software to generate IC test patterns that are used by an IC tester to determine whether or not a defect exists in an IC installed on the IC tester.

FIG. 5 is a diagram that depicts the apparatus of the present invention for testing ICs, which comprises an IC tester 50 that applies test patterns stored in a database 51 that have been generated by the IC testing software 52 executed by computer 53. An IC (not shown) is installed in the IC tester 50 in the typical manner in which ICs are installed in known IC testers for testing. A set of delay test patterns is then applied by the IC tester 50. The results of executing the test patterns are then analyzed to determine whether defects in the IC exist.

The task of analyzing the results of execution of the test patterns may be performed by the IC tester 50 or by some other computational device, such as computer 53. In accordance with the preferred embodiment, in addition to generating test patterns, the IC testing software 52 of the present invention assesses the quality of each test pattern based on certain criteria. Preferably, the quality assessments are stored in a database (e.g., database 51) in communication with the IC tester 50 and with computer 53. This enables the assessments to be used subsequently to determine which set of test patterns is the best set of test patterns to be used when testing an IC.

Figure 6:
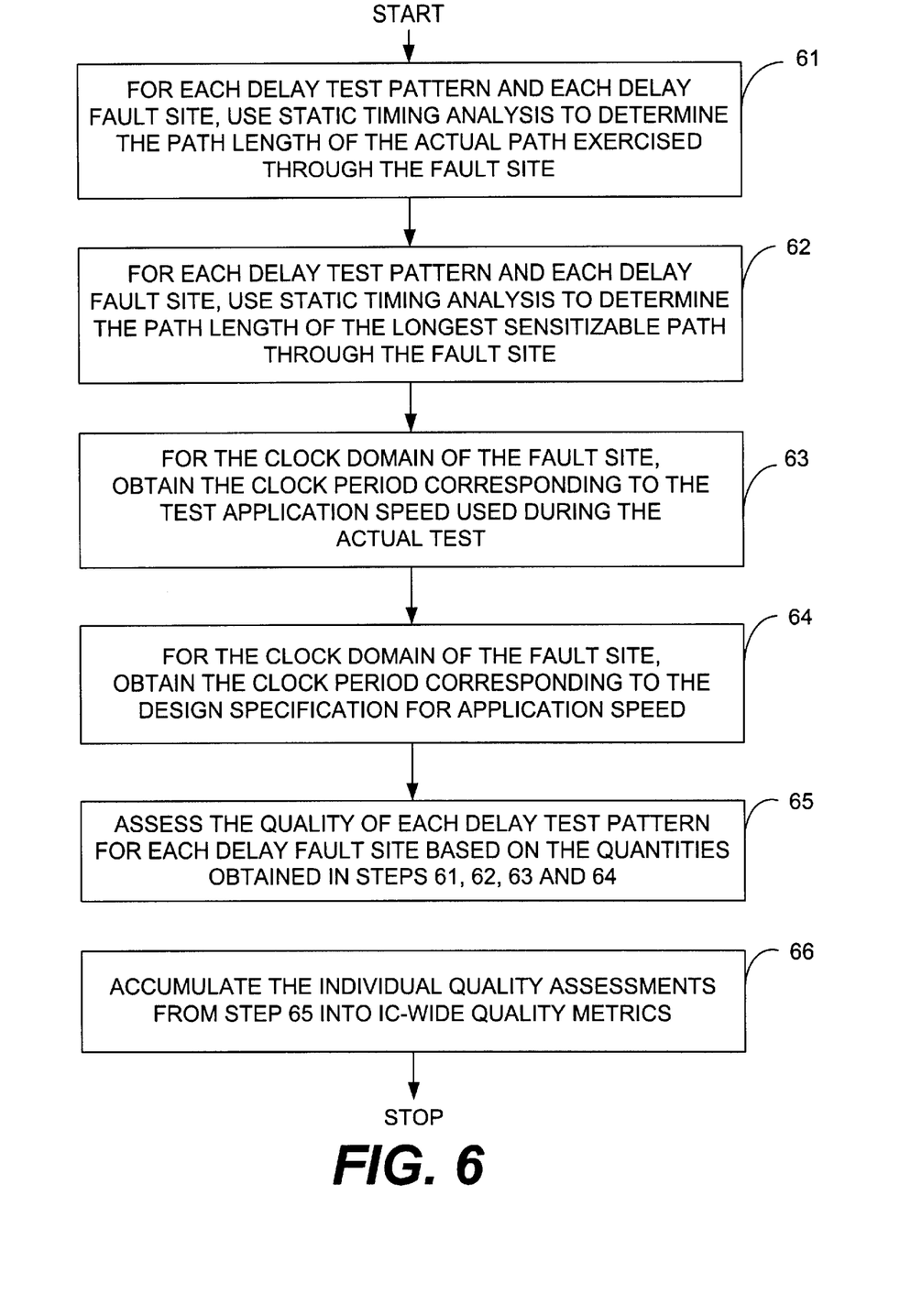
FIG. 6 is a flow chart demonstrating an example embodiment of the method of the present invention, which can be embodied in IC test generation software such as that shown in FIG. 5.

FIG. 6 is a flow chart that demonstrates the preferred embodiment of the present invention for assessing the quality of test patterns and/or test pattern sets. As stated above, all of the possible delay fault sites are known a priori from a previously generated model of the IC. For each delay test pattern and for each delay fault site, a static timing analysis is performed by the testing software 52 (or other timing analysis software) to determine 1) the path length of the actual path exercised through the fault site and 2) the path length of the longest possible path through the IC that includes the fault site. The path lengths are determined in terms of time units. These steps are represented by blocks 61 and 62, respectively. For each delay test pattern and for each fault site, the actual test application speed used to perform the test and the design specification operating speed of the particular IC are obtained, as indicated by blocks 63 and 64, respectively. These two steps are generally trivial, as all the fault sites in a given clock domain on the IC will have the same values. As indicated by block 65, the quantities obtained in the steps represented 61–64 are then used to assess the quality of the test pattern for the given fault site. There are a number of ways in which the quantities obtained in steps 61–64 can be analyzed to assess the quality of a given test pattern. The present invention is not limited to any particular algorithm for utilizing these quantities to assess the quality of a test patterns, or set of test patterns.

Figure 7:
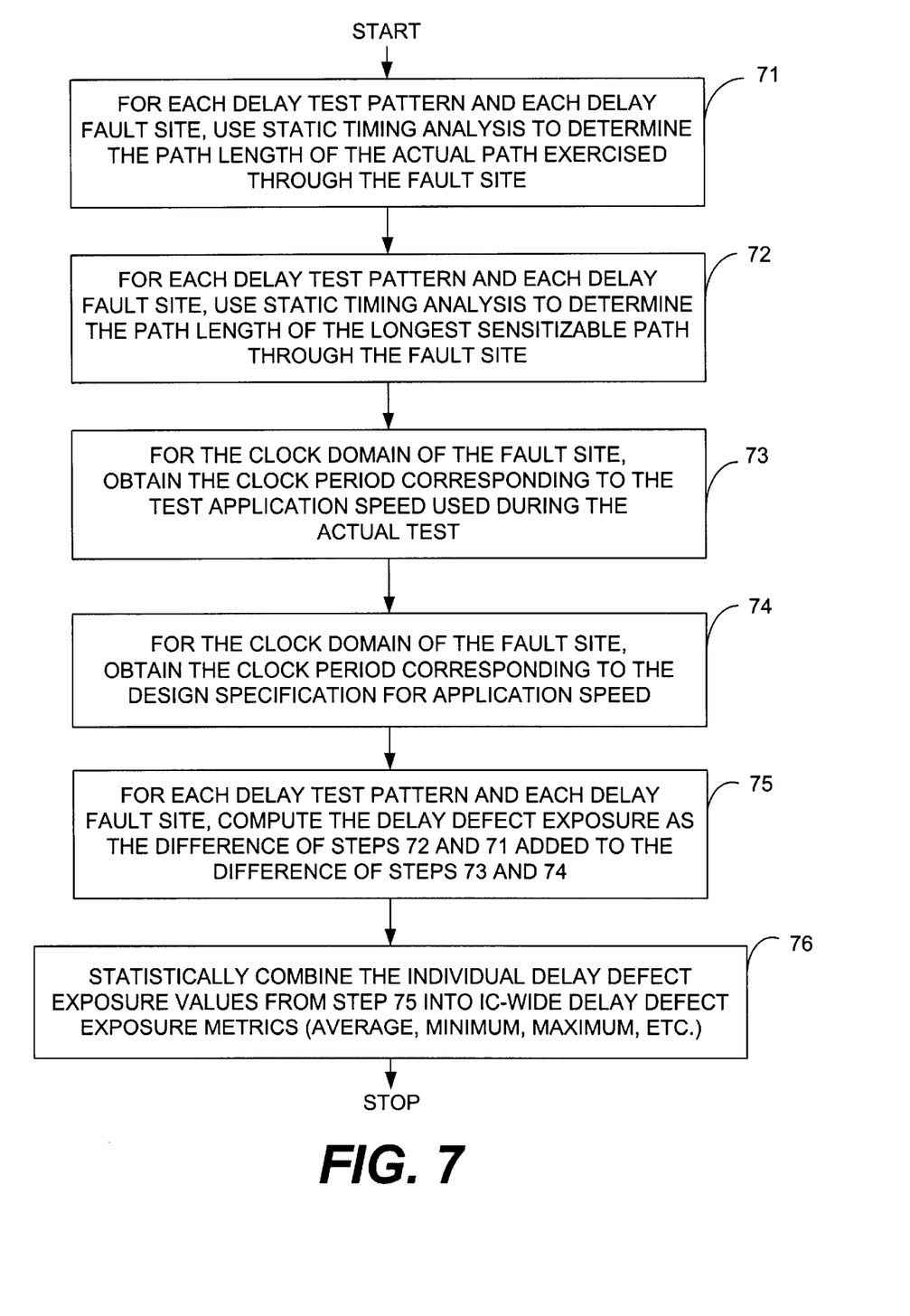
FIG. 7 is a flow chart demonstrating example embodiment of the method of the present invention to generate a first quality metric, which can be embodied in IC test generation software such as that shown in FIG. 5.

FIG. 7 is a flow chart that demonstrates the preferred embodiment of the present invention for algorithmically utilizing each of the four aforementioned quantities in order to obtain a first assessment of the quality of the test patterns. It should be noted that although the algorithm utilizes all four quantities, any one or more of these quantities may be utilized to obtain a measurement of the quality of the test pattern.

In the flow chart of FIG. 7, the steps represented by blocks 71–74 are identical in substance to the steps represented by blocks 61–64 in FIG. 6, respectively. Therefore, for purposes of brevity, the steps represented blocks 71–74 will not be discussed. However, once the four quantities have been obtained by the steps represented by blocks 71–74, these quantities preferably are manipulated in a particular manner to assess the quality of the test pattern.

In step 75, the path length, in units of time, of the actual path exercised through the fault site is subtracted from the path length, in units of time, of the longest sensitizable path through the fault site. Also in step 75, for the section of circuitry in which the delay fault resides, the operating speed required by the design specification of the IC is subtracted from the actual test application speed. Having obtained these difference values, the first quality metric, the DDE, of the test pattern is obtained by summing the difference values. The following equation defines the algorithm represented by the flow chart of FIG. 7 that is used to determine the quality of a test for a particular fault:

Delay_Defect_Exposure=(path_length (longest_sensitizable_path_through_site)−path_length (path_used))+(tester_period (actual_test)−tester_period (design_specification));

The closer the DDE is, the better the quality of the delay test pattern for this fault site because the low value indicates that there is less exposure to delay defects that go undetected. For positive (i.e., non-zero) values of DDE, any delay defects of a duration less than this value will escape the test, and thus have the potential to cause the IC to fail in a system. A negative value of the quality metric would indicate that the results of running the test pattern should always fail the test because the device is being expected to operate beyond its design specifications. It should be noted that, for a fully specified path delay test, the difference in the first term of the equation is always 0, but the quality of this path delay test pattern is still a function of the tester period used to apply it.

Figure 8:
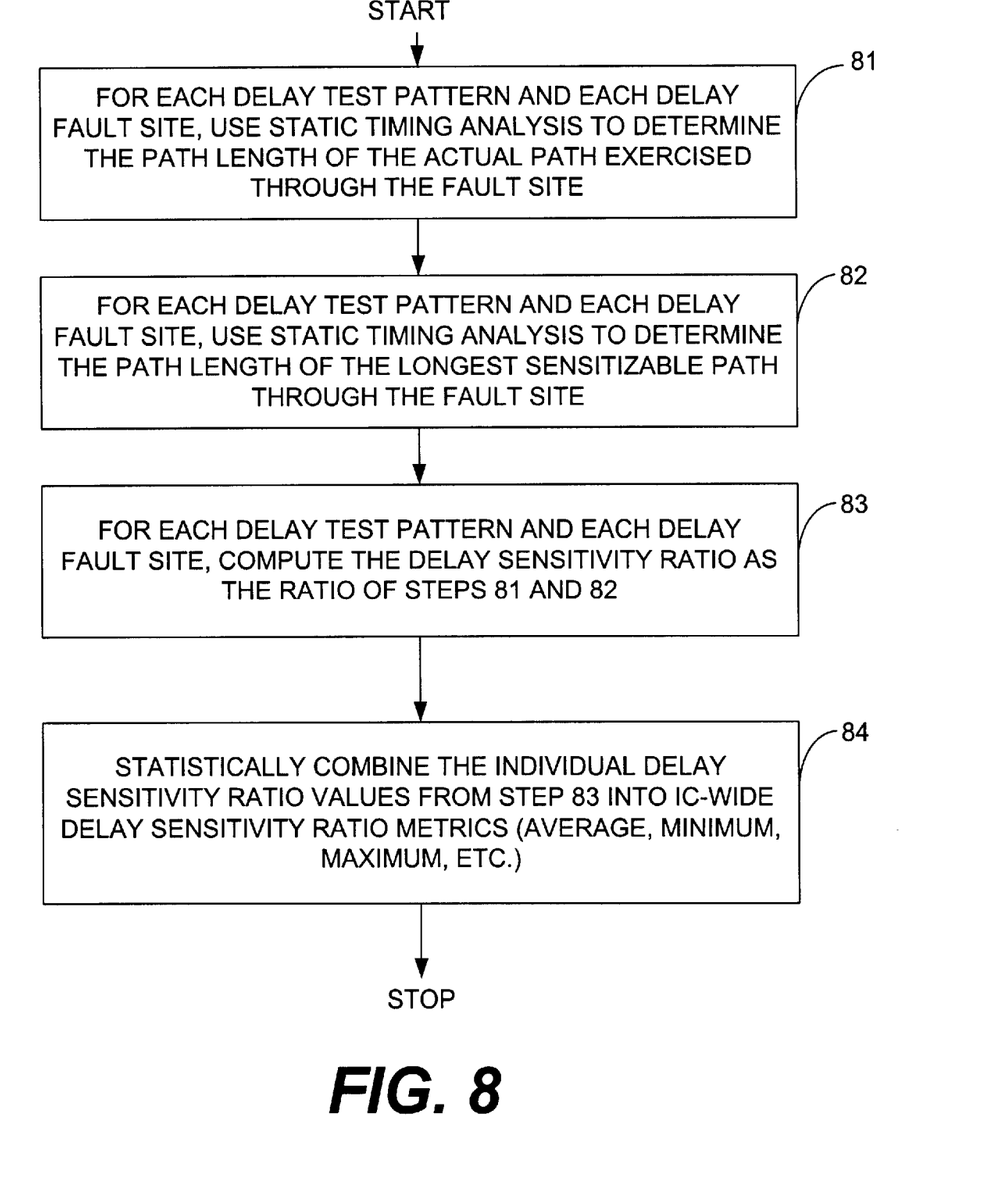
FIG. 8 is a flow chart demonstrating another example embodiment of the method of the present invention to generate a second quality metric, which can be embodied in IC test generation software such as that shown in FIG. 5.

FIG. 8 is a flow chart that demonstrates the preferred embodiment of the present invention for algorithmically utilizing two of the measured quantities in order to obtain a second assessment of the quality of the test patterns. In the flow chart of FIG. 8, the steps represented by blocks 81 and 82 are identical in substance to the steps represented by blocks 61 and 62 in FIG. 6, respectively. Therefore, for purposes of brevity, blocks 81 and 82 will not be discussed. However, once the two quantities have been obtained by the steps represented by blocks 81 and 82, these quantities preferably are manipulated in a particular manner to assess the quality of the test pattern.

In step 83, the path length, in units of time, of the actual path exercised through the fault site is divided by the path length, in units of time, of the longest sensitizable path through the fault site. This ratio represents the second quality metric, the aforementioned DSR, of the test pattern with respect to the fault site. The following equation defines the algorithm represented by the flow chart of FIG. 8 that is used to determine the quality of a test for a particular fault:

Delay_Sensitivity_Ratio=path_length (path_used)/path_length (longest_sensitizable_path_through_site);

The closer to one the DSR is, the better the quality of the delay test pattern for this fault site because there is less exposure to delay defects that could go undetected. For values of the DSR that are less than one, the test used is not as effective as another possible test, and thus there exists the potential for an IC to fail in a system. It should be noted that, for a fully specified path delay test, this metric is always equal to 1.

If a device passes this extreme test, a determination is made that it was suitably manufactured and can be shipped. In summary, in accordance with the preferred embodiment, the delays associated with (1) a longest sensitizable path through the IC that includes the delay fault and (2) an actual path exercised by the test pattern through the IC that includes the delay fault are determined. A difference between the delays is then obtained. The difference is then summed with a difference between a speed at which the test is performed and a design specification operating speed of the IC for the actual path. The sum represents the DDE quality metric associated with the test pattern. Preferably, this is performed for each fault site and for the set of test patterns associated with each fault site to enable each test pattern to be "graded". The smaller the DDE metric, the higher the quality of the test pattern at detecting the particular fault. In converse, the larger the DDE metric, the lower the quality of the test pattern at detecting the particular fault. Also, the ratio of the path lengths of the actual path exercised and the longest sensitizable path through a fault site represents the DSR quality metric associated with the test pattern. The closer this ratio is to 1, the better the test for this particular fault.

Therefore, by taking these different timing factors into account, two true quality metrics can be derived for each test pattern and for each delay fault. Furthermore, the entire set of test patterns can be graded by statistically combining the quality metrics for each fault site together to obtain an overall quality metric for the test set. Also, for each fault site, the test pattern set having the lowest, positive DDE metric corresponds to the best test pattern for testing the fault site.

It should be noted that the present invention has been described with reference to particular embodiments. However, as will be understood by persons skilled in the art in view of the discussion provided herein, the present invention is not limited to the particular embodiments described herein. For example, it is well known that logic can be implemented in different ways and with different components to achieve the same result. Therefore, it will be understood that the particular logic designs shown in FIG. 1 has logical equivalents that are also covered by the present invention although they have not been specifically described herein. These and other modifications are within the scope of the present invention.

What is claimed is:

1. An apparatus for determining a quality of test patterns used to test an integrated circuit (IC), the apparatus comprising:

first logic, the first logic determining a delay associated with a longest sensitized path through a model of the IC that includes a transition fault site and a delay associated with an actual path that includes the fault site and that is exercised by a test pattern; and second logic, the second logic obtaining at least one quality metric associated with the test pattern that exercised the actual path, said at least one quality metric being based at least in part on the delays determined by the first logic, said at least one quality metric being an indicator of whether or not the test pattern that exercised the actual path will expose a defect that exists at the fault site.

2. The apparatus of claim 1, wherein the first logic also obtains a difference between the delay associated with the longest sensitized path that includes the fault site and the delay of the actual path exercised by the test pattern, and wherein the second logic obtains a difference between a speed of testing the actual path exercised and a design specification operating speed of the IC for the actual path exercised, the second logic adding the differences together to obtain a sum, wherein said sum corresponds to a Delay Defect Exposure (DDE) quality metric, the DDE quality metric indicating a likelihood of whether the test pattern will expose a delay defect at the fault site, wherein if the delay defect at the fault site is of short enough duration, the test pattern will not expose the defect.

3. The apparatus of claim 1, wherein said first and second logic correspond to a computer executing IC testing software to generate test patterns that can be used by an IC tester to test an IC installed on the IC tester.

4. The apparatus of claim 3, further comprising third logic, the third logic analyzing the DDE quality metric to determine whether the test pattern is of relatively high or low quality in terms of an ability of the test pattern to expose a defect.

5. The apparatus of claim 4, wherein if the sum is a relatively small, positive number, the second logic determines that the test pattern is of relatively high quality.

6. The apparatus of claim 5, wherein if the sum is a relatively large, positive number, the second logic determines that the test pattern is of relatively low quality.

7. The apparatus of claim 4, further comprising fourth logic, the fourth logic obtaining a ratio of the delay associated with an actual path exercised by the test pattern that includes the fault site to the delay associated with the longest sensitized path that includes the fault site, the ratio corresponding to a Delay Sensitivity Ratio (DSR) quality metric, the determined DSR indicating a likelihood that the test pattern that exercises the actual path will expose the delay defect at the fault site included on the actual path, said ratio being greater than 0 and less than or equal to 1 for a test pattern that exercises an actual path that includes a fault site.

8. The apparatus of claim 7, wherein the closer said ratio is to 0, the lower the likelihood that the test pattern will expose the delay defect.

9. The apparatus of claim 7, wherein the closer said ratio is to 1, the higher the likelihood that the test pattern will expose the delay defect.

10. The apparatus of claim 7, further comprising fifth logic, the fifth logic analyzing the DDE and DSR quality metrics to determine the quality of each test pattern generated to exercise an actual path that includes a transition fault site.

11. The apparatus of claim 7, further comprising sixth logic, wherein the IC model includes a plurality of fault sites and wherein each fault site is tested by a respective set of test patterns, and wherein a DDE quality metric is determined by the sixth logic for each test pattern of a respective set of test patterns used to test a respective fault site, and wherein the DDE quality metrics associated with test patterns of each set of test patterns are combined by the sixth logic to obtain a cumulative DDE quality metric for each set of test patterns, each set of test patterns being graded in terms of overall quality of the set of test patterns based on the cumulative DDE quality metric of the set.

12. The apparatus of claim 11, wherein a relatively low cumulative DDE quality metric of a set of test patterns indicates that the set of test patterns has a relatively high overall quality in that the set of test patterns has a relatively high probability of exposing defects, and wherein a relatively high cumulative DDE of a set of test patterns indicates that the set of test patterns has a relatively low overall quality in that the set of test patterns may not expose all defects.

13. The apparatus of claim 12, further comprising seventh logic, wherein the IC model includes a plurality of fault sites and each fault site is tested by a respective set of test patterns, and wherein a DSR quality metric is determined by the seventh logic for each test pattern of each set of test patterns, and wherein the DSR quality metrics associated with test patterns of each set of test patterns are combined by the seventh logic to obtain a cumulative DSR quality metric for each set of test patterns, each set of test patterns being graded in terms of overall quality of the set of test patterns based on the cumulative DSR quality metric associated with the set of test patterns.

14. The apparatus of claim 13, wherein a relatively low cumulative DSR quality metric indicates that the corresponding set of test patterns has a relatively low overall quality in that the set of test patterns has a relatively low likelihood of exposing all defects at the fault site, and wherein a relatively high cumulative DSR quality metric indicates that the corresponding set of test patterns has a relatively high overall quality in that the set of test patterns has a relatively high likelihood of exposing all defects.

15. The apparatus of claim 14, wherein the first, second, third, fourth, fifth, sixth and seventh logic correspond to first, second, third, fourth, fifth, sixth and seventh algorithms, respectively, of the IC testing software and a computer that executes the IC testing software.

16. A method for determining a quality of test patterns used to test an integrated circuit (IC), the method comprising the steps of:
 determining a delay associated with a longest sensitized path through a model of the IC that includes a transition fault site and a delay associated with an actual path that includes the transition fault site and that is exercised by a test pattern; and
 obtaining at least one quality metric associated with the test pattern that exercised the actual path, said at least one quality metric being based at least in part on the determined delays, said at least one quality metric being an indicator of whether or not the test pattern that exercised the actual path will expose a defect that exists at the fault site.

17. The method of claim 16, wherein the determining step also obtains a difference between the delay associated with the longest sensitized path that includes the fault site and the delay of the actual path exercised by the test pattern, and wherein the step of obtaining said at least one quality metric based at least in part on said determined delays is accomplished by obtaining a difference between a speed of testing the actual path exercised and a design specification operating speed of the IC for the actual path exercised, and by combining the differences together to obtain a sum, wherein said sum corresponds to a Delay Defect Exposure (DDE) quality metric, the DDE quality metric indicating a likelihood of whether the test pattern will expose a delay defect at the fault site, wherein if the delay defect at the fault site is too short in duration, the test pattern will not expose the defect.

18. The method of claim 17, wherein the determining and obtaining steps are performed by a computer executing IC testing software.

19. The method of claim 18, wherein further comprising the step of:
 analyzing the DDE quality metric to determine whether the test pattern is of relatively high or low quality in terms of an ability of the test pattern to expose a defect.

20. The method of claim 19, wherein if the sum is a relatively small, positive number, a determination is made during the analyzing step that the test pattern is of relatively high quality.

21. The method of claim 19, wherein if the sum is a relatively large, positive number, a determination is made during the analyzing step that the test pattern is of relatively low quality.

22. The method of claim 19, further comprising the step of obtaining a ratio of the delay associated with an actual path exercised by the test pattern that includes the fault site to the delay associated with the longest sensitizable path that includes the fault site, the ratio corresponding to a Delay Sensitivity Ratio (DSR) quality metric, the determined DSR indicating a likelihood that the test pattern that exercises the actual path will expose the delay defect at the fault site included on the actual path, said ratio being greater than 0 and less than or equal to 1 for a test pattern that exercises an actual path that includes a fault site.

23. The method of claim 22, wherein the closer said ratio is to 0, the lower the likelihood that the test pattern will expose the delay defect.

24. The method of claim 22, wherein the closer said ratio is to 1, the higher the likelihood that the test pattern will expose the delay defect.

25. The method of claim 22, further comprising the step of analyzing the DDE and DSR quality metrics to determine the quality of each test pattern generated to exercise an actual path that includes a transition fault site.

26. The method of claim 22, wherein the IC model includes a plurality of fault sites and wherein each fault site is tested by a respective set of test patterns, the method further comprising the steps of:
 determining a DDE quality metric for each test pattern of a respective set of test patterns used to test a respective fault site;
 combining the DDE quality metrics associated with test patterns of each set of test patterns together to obtain a cumulative DDE quality metric for each set of test patterns; and grading each set of test patterns in terms of overall quality of the set of test patterns based on the cumulative DDE quality metric of the set.

27. The method of claim 26, wherein a relatively low cumulative DDE quality metric of a set of test patterns indicates that the set of test patterns has a relatively high overall quality in that the set of test patterns has a relatively high probability of exposing defects, and wherein a relatively high cumulative DDE of a set of test patterns indicates that the set of test patterns has a relatively low overall quality in that the set of test patterns may not expose all defects.

28. The method of claim 27, further comprising the step of:
   determining a DSR quality metric for each test pattern of each set of test patterns;
   adding the DSR quality metrics associated with test patterns of each set of test patterns together to obtain a cumulative DSR quality metric for each set of test patterns; and
   grading each set of test patterns in terms of overall quality of the set of test patterns based on the cumulative DSR quality metric associated with the set of test patterns.

29. The method of claim 28, wherein a relatively low cumulative DSR quality metric indicates that the corresponding set of test patterns has a relatively low overall quality in that the set of test patterns has a relatively low likelihood of exposing all defects at the fault site, and wherein a relatively high cumulative DSR quality metric indicates that the corresponding set of test patterns has a relatively high overall quality in that the set of test patterns has a relatively high likelihood of exposing all defects.

30. An integrated circuit (IC) testing computer program for generating test patterns designed to test transition fault sites of an IC, the IC testing computer program being embodied on a computer-readable medium, the program comprising:
   a first code segment for determining a delay associated with a longest sensitizable path through a model of the IC that includes a transition fault site and a delay associated with an actual path that includes the transition fault site and that is exercised by a test pattern; and
   a second code segment for obtaining at least one quality metric associated with the test pattern that exercised the actual path, said at least one quality metric being based at least in part on the determined delays, said at least one quality metric being an indicator of whether or not the test pattern that exercised the actual path will expose a defect that exists at the fault site.

31. The program of claim 30, wherein the first code segment also obtains a difference between the delay associated with the longest sensitized path that includes the fault site and the delay of the actual path exercised by the test pattern, and wherein the second code segment obtains a difference between a speed of testing the actual path exercised and a design specification operating speed of the IC for the actual path exercised, and combines the differences together to obtain a sum, wherein said sum corresponds to a Delay Defect Exposure (DDE) quality metric, the DDE quality metric indicating a likelihood of whether the test pattern will expose a delay defect at the fault site, wherein if the delay defect at the fault site is too short in duration, the test pattern will not expose the defect.

32. The program of claim 30, further comprising:
   a third code segment for analyzing the DDE quality metric to determine whether the test pattern is of relatively high or low quality in terms of an ability of the test pattern to expose a defect.

33. The program of claim 32, wherein if the sum is a relatively small, positive number, a determination is made by the third code segment that the test pattern is of relatively high quality.

34. The program of claim 32, wherein if the sum is a relatively large, positive number, a determination is made by the third code segment that the test pattern is of relatively low quality.

35. The program of claim 32, further comprising:
   a fourth code segment for obtaining a ratio of the delay associated with an actual path exercised by the test pattern to the delay associated with the longest sensitized path, the ratio corresponding to a Delay Sensitivity Ratio (DSR) quality metric, the determined DSR indicating a likelihood that the test pattern that exercises the actual path will expose the delay defect at the fault site included on the actual path, said ratio being greater than 0 and less than or equal to 1 for a test pattern that exercises an actual path that includes a fault site, wherein the closer said ratio is to 0, the lower the likelihood that the test pattern will expose the delay defect, and wherein the closer said ratio is to 1, the higher the likelihood that the test pattern will expose the delay defect.

36. The program of claim 35, further comprising:
   A fifth code segment for analyzing the DDE and DSR quality metrics to determine the quality of each test pattern generated to exercise an actual path that includes a transition fault site.

37. The program of claim 35, wherein the IC model includes a plurality of fault sites and wherein each fault site is tested by a respective set of test patterns, the program further comprising:
   a sixth code segment for determining a DDE quality metric for each test pattern of a respective set of test patterns used to test a respective fault site;
   a seventh code segment for adding the DDE quality metrics associated with test patterns of each set of test patterns together to obtain a cumulative DDE quality metric for each set of test patterns;
   an eighth code segment for determining a DSR quality metric for each test pattern of each set of test patterns;
   a ninth code segment for adding the DSR quality metrics associated with test patterns of each set of test patterns together to obtain a cumulative DSR quality metric for each set of test patterns; and
   a tenth code segment for grading each set of test patterns in terms of overall quality of the set of test patterns based on the cumulative DDE and DSR quality metrics associated with each set of test patterns.

* * * * *